United States Patent [19]

Hiruma et al.

[11] Patent Number: 4,863,831
[45] Date of Patent: Sep. 5, 1989

[54] PHOTOSENSITIVE LITHOGRAPHIC PLATE REQUIRING NO DAMPENING WATER HAVING A GELATIN PRIMER LAYER

[75] Inventors: Toshihiko Hiruma; Hiroshi Takahashi, both of Shizuoka, Japan

[73] Assignee: Fuji Photo Film Co., Ltd., Minami-ashigara, Japan

[21] Appl. No.: 201,868

[22] Filed: Jun. 3, 1988

[30] Foreign Application Priority Data

Jun. 5, 1987 [JP] Japan ................... 62-141114

[51] Int. Cl.$^4$ ............................................... G03C 1/76
[52] U.S. Cl. .................................... 430/271; 430/273; 430/539
[58] Field of Search ............... 430/271, 273, 539, 327

[56] References Cited

U.S. PATENT DOCUMENTS

| | | |
|---|---|---|
| 4,060,656 | 11/1977 | Naka et al. ................... 430/271 |
| 4,162,919 | 7/1979 | Richter et al. ................ 430/271 |
| 4,304,851 | 12/1981 | McGrail et al. ............... 430/271 |
| 4,396,709 | 8/1983 | Kameoka et al. ............. 430/539 |
| 4,427,767 | 1/1984 | Beebe et al. .................. 430/539 |
| 4,481,282 | 11/1984 | Obata et al. .................. 430/271 |

Primary Examiner—Jack P. Brammer
Attorney, Agent, or Firm—Burns, Doane, Swecker & Mathis

[57] ABSTRACT

The present invention relates to a photosensitive lithographic plate requiring no dampening water, which comprises a support, a primer layer comprising a gelatin and a silane coupling agent, a photosensitive layer, and a silicone rubber layer in this order. According to the present invention, a photosensitive lithographic plate having a primer layer with an excellent resistance to a solvent and dyeability is obtained.

9 Claims, 1 Drawing Sheet

PHOTOSENSITIVE LITHOGRAPHIC PLATE REQUIRING NO DAMPENING WATER HAVING A GELATIN PRIMER LAYER

BACKGROUND OF THE INVENTION

1. Field of the Invention

The present invention relates to a lithographic plate which does not require dampening water (hereinafter referred to as "water-less plate") and, more particularly, to a photosensitive lithographic plate which does not require dampening water (hereinafter referred to as "water-less PS plate"), which is practically useful, for example, in excellent sensitivity, developability and ink-receptive property, as well as in plate-examination property after the development.

2. Description of the Prior Art

Water-less PS plates have been known in which a photosensitive layer and a silicone rubber layer are formed in sequence on a support. Such water-less PS plates are disclosed, for example, in U.S. Pat. Nos. 3,511,178; 3,677,178; 3,894,873 and 4,342,820; and British Pat. No. 1,419,643.

Broadly, there are two methods of preparing a lithographic plate from a water-less PS plate. In one method, the portion of the photosensitive layer corresponding to an ink-receptive area (hereinafter referred to as "image area") is dissolved in a developing solution thereby to remove the portion of the silicone rubber layer on the dissolved portion of the photosensitive layer, thereby to form the image area, as disclosed in U.S. Pat. No. 3,511,178. The other method makes use of the photo-bondability and photo-releasability of the photosensitive layer to selectively remove the portions of the silicone rubber layer corresponding to the image area as disclosed in U.S. Pat. Nos. 3,894,873 and 4,342,820.

The former method is advantageous in that the developability is not substantially affected even when the strength of bonding between the silicone rubber layer and the photosensitive layer is strong enough, because the image area is formed by removing the photosensitive layer. This means that, according to this method, it is possible to obtain a plate having improved anti-scratch and anti-wear characteristics without substantially impairing the developability. On the other hand, this method in which the photosensitive layer is removed by dissolution requires that the photosensitive layer be made as thin as possible. Namely, since the image area is formed by a recess penetrating both the photosensitive layer and the silicone layer, the depth of the recess, i.e. the depth of the image area, will become large when the photosensitive layer has a large thickness. Such a large depth of the image area will require a large amount of ink to be supplied to the plate surface in order to fill such an image area of the large depth.

Under these circumstances, the present inventors have developed a water-less PS plate comprising a primer layer, a photosensitive layer and a silicone rubber layer which are formed in this order on the support. In this improved water-less PS plate, the photosensitive layer has a reduced thickness so that it can operate with a smaller amount of ink than the conventional water-less PS plate. In addition, this improved water-less PS plate exhibits superior anti-scratch and anti-wear chractristics. The present applicant has already filed applications for a patent on this improved water-less PS plate (Japanese Patent Unexamined Published Application (hereinafter referred to as "J.P. KOKAI") Nos. 60-229031 and 62-50760).

Figure 1:
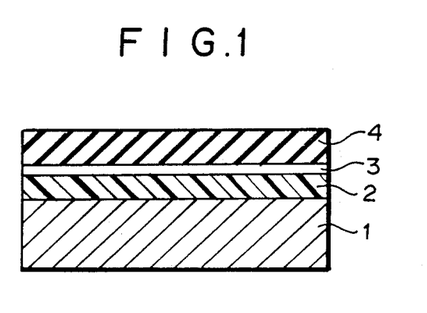
FIG. 1 is an enlarged sectional view of a water-less photosensitive lithographic plate.

FIG. 1 is an enlarged sectional view of a water-less PS plate wherein primer layer 2, photosensitive layer 3 and silicone rubber layer 4 are formed in this order on support 1.

Figure 2:
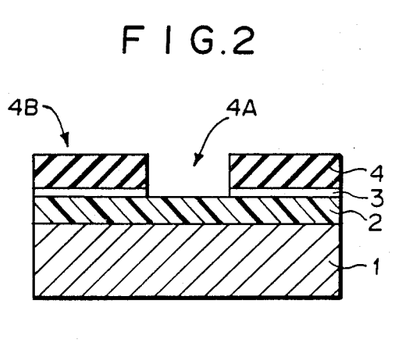
FIG. 2 is an enlarged sectional view of a water-less lithographic plate prepared by imagewise exposing the photosensitive lithographic plate shown in FIG. 1 and then developing it.

FIG. 2 is an enlarged sectional view of a water-less plate obtained by exposing and developing the water-less PS plate shown in FIG. 1, wherein image area 4A is formed by a recess which penetrates both the silicone rubber layer and the photosensitive layer and through which the surface of the primer layer 2 can be seen.

A resistance to organic solvents (hereinafter referred to as "solvent resistance") is required for the primer layer. Namely, the primer layer should not be dissolved in or peeled off by an organic solvent used for formation of the photosensitive layer and silicone rubber layer thereon or by a developing solution containing an organic solvent. Further, and excellent dyeability is also required for the primer layer, since the primer layer exposed by the development (i.e. image area) is dyed to facilitate the examination of the plate after the development.

Although the primer layer formed by photo-hardening the photo-dimerization type photo-hardening resin layer as described in the above-mentioned J.P. KOKAI No. 60-229031 has an excellent solvent resistance, it has a defect that the dyeability thereof is poor. The primer layer comprising the hardened epoxy resin described in the above-mentioned J.P. KOKAI No. 62-50760 has defects that when it is hardened sufficiently for imparting the solvent resistance, its dyeability is reduced and, on the contrary, when its degree of hardening is reduced so as to keep the dyeability thereof, its solvent resistance becomes insufficient. It is thus difficult to obtain a water-less PS plate containing a primer layer possessing a good solvent resistance as well as a good dyeability.

SUMMARY OF THE INVENTION

Accordingly, an object of the present invention is to provide a water-less PS plate comprising a primer layer, a photosensitive layer and a silicone rubber layer formed in this order on a support, wherein the primer layer exhibits a sufficiently high solvent resistance and wherein the image area of the bare primer layer during or after the development is easily dyeable so as to afford an easy examination of the plate after the development.

Another object of the present invention is to provide a water-less PS plate having a primer layer sufficiently resistant to not only a developing solution containing a large amount of an organic solvent but also an aqueous developing solution as described in J.P. KOKAI No. 61-275759.

Still another object of the present invention is to provide a water-less PS plate in which the image area of the bare primer layer after the development can be easily and stably dyed with a dyeing solution in an organic solvent or in water.

After intensive investigations, the inventors have found that the above-described objects of the present invention can be attained by a water-less PS plate comprising a support; a primer layer formed on the support and containing gelatin and a silane coupling agent; a photosensitive layer formed on the primer layer; and a silicone rubber layer formed on the photosensitive layer.

The inventors have also found that when the degree of swelling of the primer layer with water at 20° C. is not higher than 150%, the primer layer has a further improved resistance to the aqueous developing solution and it exhibits a sufficient resistance to an aqueous dyeing solution even when the image area of the base primer layer is dyed by strongly rubbing it with the aqueous dyeing solution.

DESCRIPTION OF THE PREFERRED EMBODIMENTS

A detailed description will be made hereinunder as to the water-less PS plate of the present invention and a method of producing the same.

SUPPORT

In general, the support is required to have a flexibility which is high enough to enable the plate to be mounted on an ordinary lithographic press, as well as strength high enough to withstand the load applied during printing. Typical examples of the supports include metallic sheets such as of aluminum, copper and steel, films or sheets of plastics such as polyethylene terephthalate, coated paper and rubber.

It is also possible to use a composite support such as a sheet of paper or plastic having aluminum layers on both surfaces thereof, a rubbery elastic support, a support having a rubbery elastic layer or a cylindical support.

PRIMER LAYER

The primer layer usable in the present invention contains gelatin as a binder.

Gelatin generally known as photographic gelatin, which is most suitably obtained by an acid treatment or alkali treatment of bones and skins of cattle, may be used. This, however, it not exclusive and various natural gelatins in the form of natural polymeric compounds in the form of condensates of various amino acids of a following general formula can be used:

There are so many kinds of amino acids which constitute gelatin, and various compositions of gelatina are obtainable according to the processing conditions and the starting material used.

The primer layer of the present invention contains a silane coupling agent. The silane coupling agent improves the bonding power to the support and imparts water resistance to the primer layer. The silane coupling agents usable in the present invention are well-known ones such as those described in "Hyomen (the surface)", 21, 157 to 167 (1983) and E. P. Plueddemann "Silane Coupling Agents", Plenum Press (1982).

The suitable silane coupling agents according to the present invention include those of the following general formula:

wherein R represents a hydrogen atom or an alkyl group having 1 to 5 carbon atoms, X represents an alkyl group, a vinyl group or an organic group having a functional group capable of bonding with an organic matrix polymer or having an affinity for the organic matrix polymer, Y represents a hydroxyl group or an organic group which can be hydrolyzed to form a hydroxyl group, and n is a number of 2 or 3.

When X is an alkyl group, it is preferably methyl group. When X is an organic group having a functional group capable of bonding with an organic matrix polymer or having an affinity therefor, the functional group is, for example, a vinyl, acryloyl, amino, quaternary ammonium, epoxy or mercapto group or a chlorine atom. The organic group exclusive of the functional group is preferably an aliphatic hydrocarbon group which may have an aromatic hydrocarbon group therein. Preferred examples of the organic groups having such a functional group include N-(β-aminoethyl)-γ-aminopropyl group, γ-methacryloyloxypropyl group, N-[β-(N-vinylbenzylamino)ethyl]-γ-aminopropyl group, γ-glycidoxypropyl group, γ-mercaptopropyl group, γ-chloropropyl group, γ-anilinopropyl group and $C_{18}H_{37}$—$N^+(CH_3)_2$—$(CH_2)_3$—.

The organic groups Y which can be hydrolyzed to form a hydroxyl group include, for example, alkoxy groups having 1 to 5 carbon atoms (preferably, for example, methoxy group), alkoxyalkoxy groups having 3 to 5 carbon atoms (preferably, for example, β-methoxyethoxy group), acyloxy groups having 2 to 5 carbon atoms (preferably, for example, acetyloxy group), dialkylamino groups (preferably, for example, dimethylamino group), chlorine atom and trimethylsilylamino group.

Typical examples of the silane coupling agents usable in the present invention are as follows:

(1) Silane coupling agents having an unsaturated group: vinyltrimethoxysilane, vinyltriethoxysilane, vinyltris(β-methoxyethoxy)silane, vinyltrichlorosilane, γ-(methacryloxypropyl)trimethoxysilane, vinyltriacetoxysilane, etc.

(2) Silane coupling agents having an amino group: N-(β-aminoethyl)-γ-aminopropyltrimethoxysilane, N-(β-aminoethyl)-γ-aminopropylmethyldimethoxysilane, γ-aminopropyltriethoxysilane, N-phenyl-γ-aminopropyltrimethoxysilane, etc.

(3) Silane coupling agents having an epoxy group: γ-glycidoxypropyltrimethoxysilane, γ-glycidoxypropylmethyldimethoxysilane, β-(3,4-epoxycyclohexyl)ethyltrimethoxysilane, etc.

(4) Silane coupling agents having a mercapto group: γ-mercaptopropyltrimethoxysilane, γ-mercaptopropylmethyldimethoxysilane, etc., and (5) Silane coupling agents having a chlorine atom: γ-chloropropyltrimethoxysilane, γ-chloropropylmethyldimethoxysilane, methyltrichlorosilane and dimethyldichlorosilane.

The silane coupling agent may be incorporated into the gelatin primer layer, or a silane coupling agent layer may be provided as a bonding layer between the support and the gelatin primer layer. To obtain a higher water resistance, it is preferable that the silane coupling agent is incorporated into the gelatin primer layer. In such a case, a silane coupling agent having a high solubility in water or in an alcohol is preferably used.

When a silane coupling agent capable of bonding, by a chemical reaction, with functional groups of the gelatin and a gelatin hardener are used, it is desirable that the silane coupling agent is capable of bonding, by the chemical reaction, with the gelatin or hardener.

Such particularly preferred silane coupling agents include, for example, N-(β-aminoethyl)-γ-aminopropyltrimethoxysilane, N-(β-aminoethyl)-γ-aminopropylmethyldimethoxysilane, glycidoxypropyltrimethoxysilane and vinyltrichlorosilane.

The amount of the silane coupling agent is preferably 1 to 20 wt. %, particularly 3 to 10 wt. %, based on the gelatin. When the amount of the silane coupling agent is less than 1%, the water resistance is insufficient and, on the contrary, when it exceeds 20%, the developability and dyeability are reduced.

A part or the whole of the silane coupling agent can be replaced with a titanium coupling agent having the same function as that of the silane coupling agent.

In a particularly preferred embodiment of the present invention, the degree of swelling of the gelatin primer layer with water at 20° C. is adjusted to at most 150%, particularly at most 100%, so as to further improve the water resistance of the primer layer.

The term "degree of swelling" is herein defined as follows:

$$\text{Degree of swelling} = \frac{d_2 - d_1}{d_1} \times 100\%$$

wherein
$d_1$ represents the thickness of the gelatin before the swelling and
$d_2$ represents that after the swelling.

In practice, the thickness of the gelatin layer after the swelling was determined by a method described on pages 205 to 210 of Journal of Photographic Science, Vol. 20 (1972).

The method of hardening the gelatin layer is not limited so far as the degree of swelling of the gelatin layer can be adjusted to not higher than 150%, preferably not higher than 100%. The most popular method comprises the use of a hardener.

The following hardeners are usable for hardening (i.e. crosslinking) the gelatin:
(A) Inorganic hardeners: chromium alum and aluminum alum
(B) Organic hardeners:
(B-1) aldehyde hardeners: formaldehyde, glyoxal, succinaldehyde, glutaldehyde, etc.
(B-2) N-methylol and acetal hardeners:

etc.
(B-3) epoxy hardeners:

etc.
(B-4) aziridine hardeners:

etc.
(B-5) mucohalogen acid hardeners:

etc.
(B-6) active halogen hardeners:

etc.
(B-7) dichloro-S-triazine hardeners:

etc.
(B-8) active olefin hardeners:

-continued etc.

(B-9) carbodiimide hardeners:

etc.

(B-10) isoxazolium salt hardeners:

etc.

(B-11) methanesulfonic acid ester hardeners:

etc.

(B-12) active ester hardeners:

etc.

It will be obvious that different types of hardeners are used depending on the type of the amino acid in the gelatin to be hardened. It will also be understood that the amino acid composition varies depending on the gelatin.

Thus, the optimum amount of the hardener varies depending on the kinds of gelatin and hardening agent. In general, however the optimum amount of the hardener generally ranges 1 to 200 mmol, preferably 5 to 50 mmol, for 100 weight parts of gelatin.

The larger the amount of the hardener, the lower the degree of swelling. However, even when the amount of the hardener is increased over a certain range, the degree of swelling is no more decreased. The possible degree of swelling varies depending on the hardener and the hardening conditions.

The thickness of the primer layer of the present invention is 0.1 to 50μ, preferably 0.5 to 20μ. The gelatin is preferably cured by an ordinary measure such as heating the primer layer, after applying the gelatin and the hardener to the support.

The primer layer used in the present invention may be prepared by forming a layer comprising a gelatin and a silane coupling agent and then coating this layer with a hardener solultion in order to cause the hardener to penetrate it. By this method, the primer layer can be quickly hardened. As a solvent for the hardener solution, a mixed solvent of a lower alcohol such as methanol with water at a weight ratio of 90:10 to 50:50 can be used. The concentration of the hardener in the solution is much preferably 1 to 5 wt. %.

The primer layer can contain, if necessary, a filler such as titanium oxide, an anti-halation agent, a combination of dye with an acid generating agent for imparting printability, and so forth.

PHOTOSENSITIVE LAYER

The photosensitive layer usable in the present invention may be of any type, provided that its solubility in a developing solution is changed by the exposure.

Thus, the following compounds and compositions are usable as the material for the photosensitive layer.

(1) A composition comprising an unsaturated monomer having a boiling point of at least 100° C. and non-volatile at room temperature or its oligomer, a photo-sensitizer, a heat-polymerization inhibitor and, if necessary, a filler for maintaining the shape at room temperature, and some additives.

Examples of the unsaturated monomers include: acrylic and methacrylic esters such as ethylene glycol di(meth)acrylate, polyethylene glyccol di(meth)acrylate, hydroxyethyl(meth)acrylate, hydroxypropyl(-meth)acrylate, glycidyl(meth)acrylate, 1-chloro-2-hydroxyethyl(meth)acrylate and dimethylaminoethyl(-meth)acrylate; acrylamide derivatives such as ethylene bisacrylamide, N-methylol acrylamide, and methoxymethyl acrylamide; esters of allylalcohol such as triallyl cyanurate, triallyl phosphate, diallyl phthalate and diallyl maleate; as well as trimethylolethane tri(meth)acrylate, trimethylolpropane tri(meth)acrylate, pentaerythritol tetra(meth)acrylate, dipentaerythritol penta(-meth)acrylate and dipentaerythritol hex(meth)acrylate.

Examples of the photosensitizer include benzophenon derivatives, benzoin derivatives, anthraquinone derivatives; aldehydes, ketones, sulfur compounds, halides, and dyestuffs such as Methylene Blue and riboflavin.

Examples of heat-polymerization inhibitors include hydroquinone derivatives, phenol derivatives, nitro-substituted benzenes, tertiary amines and phenothiazine derivatives.

Examples of materials usable as the filler or the additives include: fine powders of inorganic matters such as colloidal silica, calcium carbonate, magnesium carbonate, iron oxides; as well as polyvinyl acetate, poly(meth-)acrylates, polyethylenes having a molecular weight of several thousands, polypropylene, polyvinyl chloride, vinyl polymers such as polyvinylidene chloride, uncured resol phenol resins, urea resins, melamine resins, epoxy resins and unsaturated polyester resins.

Homopolymers and copolymers comprising a monomer of the following general formula [I] can also be used as the filler:

(I)

wherein R represents a hydrogen atom or methyl group, $R_1$, $R_2$, $R_3$, $R_4$ and $R_5$ each represents a hydrogen atom, halogen atom, alkyl group, alkoxy group, cyano group or carboxyl group, Z represents an oxygen atom, sulfur atom, —NH— or —NR'—, R' being an alkyl group.

(2) A composition comprising a polymer having the following group in its main chain or side chain:

wherein R represents an alkyl group having 1 to 10 carbon atoms.

A composition mainly comprising a photosensitive polymer such as a polyester, polyamide or polycarbonate having, in the main or side chain, the following group:

(Examples of such compounds are described in U.S. Pat. Nos. 3,030,208, 3,707,373 and 3,453,237.); a composition mainly comprising a photosensitive polyester derived from a 2-propelidenemalonic acid compound such as cynnamylidene malonic acid and a bifunctional glycol. (Examples of such compositions are described in, for example, U.S. Pat. Nos. 2,956,878 and 3,173,787.); cinnamic acid esters of polymers having a hydroxyl group such as polyvinyl alcohol, starch, cellulose, etc. (Examples of them are described in U.S. Pat. Nos. 2,690,966, 2,752,372 and 2,732,301). Further, polymers such as those described in J.P. KOKAI Nos. 58-25302 and 59-17550 can also be used in the present invention.

(3) A composition comprising a homopolymer or copolymer of a monomer of the following general formula [I] and a photosensitizer:

(I)

wherein R represents a hydrogen atom or methyl group, $R_1$, $R_2$, $R_3$, $R_4$ and $R_5$ each represents a hydrogen atom, halogen atom, alkyl group, alkoxy group, cyano group or carboxyl group, and Z represents an oxygen, sulfur, —NH— or —NR'—, R' being an alkyl group.

The photosensitizers include, for example, α-carbonyl compounds described in U.S. Pat. Nos. 2,367,661 and 2,367,670, acyloin ethers described in U.S. Pat. No. 2,448,828, aromatic acyloin compounds substituted with an α-hydrocarbon described in U.S. Pat. No. 2,722,512, polynuclear quinone compounds described in U.S. Pat. Nos. 3,046,127 and 2,951,758, a combination of a triarylimidazole dimer and p-aminophenyl ketone described in U.S. Pat. No. 3,549,367, trihalomethyl-S-triazine compounds described in U.S. Pat. Nos. 4,239,850 and 4,619,998, acridine and phenazine compounds described in U.S. Pat. No. 3,751,259, and oxadiazole compounds described in U.S. Pat. No. 4,212,970.

(4) A composition containing a photo-setting diazo resin or a photosensitive azido resin and, if necessary, a photosensitizer and a small amount of a filler:

Examples of the photo-setting diazo resins include zinc chloride double salts of condensates of formaldehyde with a diazoamine such as p-diazodiphenylamine, p-diazomonoethylaniline, and p-diazobenzylethylaniline.

Examples of the photo-setting azido resins include azidophthalic acid ester of polyvinylalcohol, azidobenzoic acid ester of polyvinyl alcohol, and ester of stylenemaleic anhydride copolymer with an aromatic azido alcohol such as β-(4-azidophenol)ethanol.

Photosensitizers, fillers and additives mentioned in (1) above can be used also in this case.

(5) A composition comprising O-quinone diazide compound:

O-quinone azido compounds most suitably usable are O-naphthoquinone diazide compounds disclosed in many publications such as the specifications of U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709 and 3,647,443.

Among these o-quinone diazide compounds, preferred are: o-naphthoquinonediazide sulfonic esters and o-naphthoquinonediazide carboxylic esters of aromatic hydroxyl compounds; and o-naphthoquinonediazide sulfonic acid amide or o-naphthoquinoediazide-carboxylic acid amide of aromatic amine compound. Examples of them are: esters of benzoquinone-1,2-diazide-sulfonic acid or naphthoquinone-1,2-diazide-sulfonic acid with polyhydroxyphenyl (including partial esters: the same shall apply hereinafter); ester of naphthoquinone-1,2-diazido-4-sulfonic acid or naphthoquinone-1,2-diazido-5-sulfonic acid with pyrogallol acetone resin; ester of benzoquinone-1,2-diazidosulfonic acid or naphthoquinone-1,2-diazidosulfonic acid with novolak phenolformaldehyde resin or novolak cresolformaldehyde resin; amides of poly(p-aminostyrene) with naphthoquinone-1,2-diazido-4-sulfonic acid or naphthoquinone-1,2-diazido-5-sulfonic acid; esters of poly-p-hydronystyrene with naphthoquinone-1,2-diazido-4-sulfonic acid or naphthoquinone-1,2-diazido-5-sulfonic acid; esters of polyethyleneglycol with naphthoquinone-1,2-diazido-4-sulfonic acid or naphthoquinone-1,2-diazido-5-sulfonic acid; amides of polymeric amine with naphthoquinone-1,2-diazido-4-sulfonic acid or naphthoquinone-1,2-diazido-5-sulfonic acid; esters of polymethacrylic acid p-hydroxyanilide and naphthoquinone-1,2-diazido-4-sulfonic acid or naphthoquinone-1,2-diazido-5-sulfonic acid; amides of amine-denatured natural resin rosin with naphthoquinone-1,2-diazido-5-sulfonic acid; esters of an epoxy resin (from bisphenol A and propylene oxide) with naphthoquinone-1,2-diazido-5-sulfonic acid; esters of polymer of monoester of (metha)acrylic acid with dihydroxyphenyl and naphthoquinone-1,2-diazido-4-sulfonic acid or naphthoquinone-1,2-diazido -5-sulfonic acid; polymers of condensate of diallyl aminoisophthalate and naphthoqinonediazidosulfonate; esters of polycarbonate and quinonediazidesulfonate; quinonediazides cross-linked with an isocyanate or the like; esters of bisphenol A with naphthoquinone-1,2-diazide-4-sulfonic acid or naphthoquinone-1,2-diazido-5-sulfonic acid; esters or naphthoquinone-1,2-diazido-5-sulfonic acid with a phenol such as phenol or p-cresol or with an alcohol such as ethyl alcohol, propyl alcohol, butyl alcohol or amyl alcohol; and acid amides of naphthoquinone-1,2-diazido-5-sulfonic acid with an amine such as aniline or p-hydroxyaniline.

As explained before, the thickness of the photosensitive layer is preferably reduced as much as possible insofar as the photosensitive layer and the silicone rubber layer in the image area are removable in the developing process after the exposure. Usually, however, it is advisable that the thickness of the photosensitive layer is generally below 1.5μ, particularly between 0.1 and 1μ.

In order to enhance the strength of the bonding power between the primer layer and the photosensitive layer, an organic tin compound and a silane coupling agent may be incorporated in the photosensitive layer.

The organic tin compound usable herein has the following structural formula:

wherein $R^1$ represents an alkyl group having 1 to 6 carbon atoms and $R^2$ represents an alkyl group having 1 to 20 carbon atoms. Typical examples of the organic tin compounds include dibutyltin dioctanoate, dibutyltin dilaurate, dibutyltin diacetate and tin (II) octanoate.

Aminosilanes are preferably used as the silane coupling agent. The aminosilanes mentioned in this specification generally involve substances represented by the following formula:

wherein R represents an alkyl group having an unsubstituted or substituted amino group, R' and R'' each represents an alkyl group or an aryl group, m represents 1 or 2, n represents 0 or 1, and the total of m and n is 1 or 2.

Typical examples of the aminosilanes are 3-aminopropyl triethoxysilane, N-(2-aminoethyl)-3-aminopropyl trimethoxysilane, 3-aminopropyltrimethoxysilane, bis[3-(trimethoxysilyl)propyl]amine, bis[3-trimethoxysilyl)propyl]ethylenediamine, N-(3-trimethoxysilylpropyl)morpholine, trimethoxysilylpropyldiethylenetriamine, bis(2-hydroxyethyl)aminopropyltriethoxysilane, 3-aminopropylmethyldiethoxysilane, (N,N-diethyl-3-amino)propyltrimethoxysilane, (N,N-dimethyl-3-amino)propyltrimethoxysilane, N-methylaminopropyltrimethoxysilane, N-phenylaminopropyltrimethoxysilane, 1-trimethoxysilyl-2-(p-aminomethyl)phenylethane, 1-trimethoxysilyl-2-(m-aminomethyl)phenylethane, and trimethoxysilyl propylallylamine.

Aromatic aminosilane compounds having the following structural formulae are also usable.

wherein
n represents a number of 1 to 3,
$R^1$ represents an alkyl group having 1 to 3 carbon atoms or a phenyl group,
X represents a hydrolyzable group such as a functional group, for example:

wherein $R^2$ and $R^3$ each represents an alkyl or a substituted alkyl group having 1 to 3 atoms.

It is also possible to use a reactive silane compound having an allyl isocyanurate group.

The reactive silane compounds having an allyl isocyanurate group usable in the present invention are, for example, those of the following formula:

wherein
$R^1$ represents a bivalent coupling group containing at least one of carbon, oxygen, nitrogen and so forth, e.g. —$C_3H_6$—, —$C_3H_6$—NH—$C_3H_6$, and so forth,
$R^2$ represents an alkyl group having 1 to 3 carbon atoms or a phenyl group,
X represents a hydrolyzable group such as a functional group, for example:

and so forth,

R³ and R⁴ each represents an unsubstituted or substituted alkyl group having 1 to 3 atoms, a represents 1 or 2, and n represents 1, 2 or 3.

It is also possible to use a reactive silane compound having a ketoxime group.

The reactive silane compounds having ketoxime group are particularly preferably those of the following general formula:

wherein R¹ represents an alkyl group having 1 to 3 carbon atoms (e.g., methyl group, ethyl group or propyl group), an alkenyl group having 2 to 5 carbon atoms (e.g., vinyl group or aryl group), an aminoalkyl group [e.g., N-(β-aminoethyl)-γ-aminopropyl group or γ-aminopropyl group], an aminoalkyl phenylalkylene group having an aromatic nucleus in the alkylene chain [e.g., N-(β-aminoethyl)aminomethylphenethyl group], γ-(meth)acryloxypropyl group, γ-glicydoxypropyl group or γ-mercaptopropyl group; R² represents an alkyl group having 1 to 3 carbon atoms; and R³ and R⁴ each represents an alkyl group having 1 to 3 carbon atoms or they are partially bonded to each other to form a 5- or 6-membered cycloalkane ring.

The total amount of the organic tin compound and the silane coupling agent in the photosensitive layer is selected in the range of 1 to 20 wt.%, preferably 3 to 15 wt. % based on the photosensitive resin.

When the total amount of them is below 1%, no remarkable improvement is achieved in the bonding strength. On the other hand, if it exceeds 20%, bad influences are exerted thereon. Namely, for example, the photosensitivity and the developability of the photosensitive resin are seriously impaired.

The ratio of the organic tin compound to the silane coupling agent (organic tin compound/silane coupling agent) is selected to range 0.2 to 5.

When the ratio is out of the range specified above, no remarkable improvement is attained in the bonding strength, as in the case where the organic tin compound or the silane coupling agent is added alone.

SILICONE RUBBER LAYER

The silicone rubber layer usable in the present invention is composed mainly a linear organic polysiloxane having a molecular weight of 1,000 to 1,000,000 and having the following recurring unit:

wherein R represents an alkyl group having 1 to 10 carbon atoms or a phenyl group. Preferably, not less than 60% of R groups comprises methyl groups. Such a linear organic polysiloxane is usually used in the form of a crosslinked silicone rubber formed by, the addition of a reactive crosslinking agent. Examples of the crosslinkers usable for the treatment of a so-called room (low)-temperature curing silicone rubber include silanes having or not having a monovalent organic group bonded to the silicon atom, such as acetoxysilane, ketooximesilane, amidosilane, alkoxysilane and hydroxysilane; and low-polymerization condensates of these silanes such as siloxanes and organo-hydrogenpolysiloxanes. In some cases, in order to improve the bonding strength between the photosensitive layer and the silicone rubber layer and to maintain the interlaminer bonding strength for a long period of time, a reactive silane compound having an aryl isocyanurate group or a reactive silane compound having an aminoalkyl group is added to the silicone rubber composition.

The amount of the reactive crosslinker and/or the reactive silane compound in the silicone rubber layer is selected to range 0.05 to 10%, preferably 0.1 to 5%. These bonding components may be used together in the form of a mixture.

The silicone rubber layer usually contains a small amount of an organic tin compound as a catalyst.

The silicone rubber layer preferably has a small thickness in order to attain a high tone reproducibility, but a certain minimum thickness is required from the viewpoint of durability in the printing and prevention of scumming. Usually, the silicone rubber layer has a thickness of 0.5 to 10μ, preferably 1.0 to 3.0μ.

The water-less PS plate in accordance with the present invention basically has the above-described structure. The invention, however, does not exclude the formation of a bonding layer between the photosensitive layer and the silicone rubber layer. Such a bonding layer may be formed from various reactive crosslinkers and silane coupling agents. Amongst these materials of the bonding layer, used most effectively are silane coupling agents having an oxime group, reactive silicone compounds having an aminoalkyl group, reactive silicone compound having an aryl isocyanurate group, and an organic titanate compound (titanium primer).

The thickness of the bonding layer may be theoretically not less than that of the monomolecular film. From the viewpoint of the practical application operation, the bonding layer generally has a thickness of between 10 μm and 0.5μ. A too large thickness is not preferred from the viewpoint of economy and seriously deteriorates the image reproducibility because such a large thickness adversely affects the penetration of the developing solution into the photosensitive layer.

The water-less PS plate of the present invention may have a protective film formed on the silicone rubber layer, if desired.

PLATE-MAKING PROCESS

The water-less PS plate according to the present invention is first exposed through an image-bearing transparency and the resulting plate is developed with a developing solution which can dissolve the photosensitive layer in the image area, whereby the portions of the photosensitive layer and the silicone rubber layer thereon corresponding to the image area are removed, thus forming the water-less lithographic plate.

Various light sources can be used for the purpose of exposure such as an ultra-high pressure mercury lamp, carbon arc lamp, metal halide lamp, xenon lamp, chemical lamp, fluorescent lamp and solar rays.

The developing solution usable in the development of an image on the PS plate of the present invention may be any developing solution conventionally used for the purpose of development on water-less PS plates. Examples of such developing solutions include aliphatic hydrocarbons [e.g. hexane, heptane, "ISOPAR E, H and G" (trademark names of aliphatic hydrocarbons produced by Esso Kagaku)], gasoline, kerosene, aromatic hydrocarbons (toluene, xylene and so forth), or halogenated hydrocarbons (trichlene). These developing solutions contain one of the following polar solvents:
  alcohols (such as methanol, ethanol and water)
  ethers (such as methyl cellosolve, ethyl cellosolve, buty cellosolve, methyl carbitol, ethyl carbitol, butyl carbitol and dioxane)
  ketones (such as acetone and methyl ethyl ketone)
  esters (such as ethyl acetate, methyl cellosolve acetate, cellosolve acetate and carbitol acetate)

Further, an aqueous developing solution as described in J.P. KOKAI No. 61-275759 may also be used.

The aqueous developing solutions are particularly preferred, since they have a high safety in ignition and, therefore, they are advantageous for designing an automatic developing machine.

The development is conducted by an ordinary method such as rubbing the plate with a developing pad containing the above-mentioned developing solution or by rubbing the plate with a developing brush after pouring the developing solution onto the plate. As a result, the silicone rubber layer and the photosensitive layer are removed in the region corresponding to the image area and the surface of the primer layer reveals so as to provide an ink receptive portion.

The water-less plate obtained by developing the water-less PS plate of the present invention can be dyed with a dyeing solution after the development. The dyeing solution must have a nature to selectively dye the primer layer but it substantially does not dye the silicone rubber layer in the non-image area.

More specifically, the dye solution used is suitably formed by dissolving or dispersing, in a solvent having a strong polarity such as water or alcohol, a dye such as a basic dye, acidic dye or disperse dye.

In order to improve the dyeability, it is effective to add a suitable dyeing aid such as a carboxylic acid, an amine, or a surfactant.

It is preferred that the development and dyeing are conducted in different steps as explained above, because such a process facilitates the design of the developing solution and dyeing solution. However, the development and the dyeing may be conducted simultaneously by using a developing solution containing a dye in case the developing solution is capable of swelling the primer layer to some extent.

From the foregoing description, it will be understood that the present invention provides water-less PS plate having solvent resistance, water resistance and plate-examination properties.

A special advantage of the water-less PS plate of the present invention is that, since it has an excellent water resistance, it can be treated with an aqueous developing solution, which use is safer than that of an organic developing solution and which is more advantageous from the viewpoint of designing an automatic developing machine.

Another advantage of the PS plate of the present invention is that, since it has an excellent water resistance, the design latitude for the dyeing solution is broad and strong rubbing is possible in the dyeing step. As a result, the dyeing of fine portions such as fine points in the highlights and film-edge-traces is facilitated and more precise plate examination is made possible. The characteristic feature of the gelatin primer layer, containing the silane coupling agent according to the present invention is exhibited particularly in a water-less PS plate designed so that the photosensitive layer and the silicone rubber layer placed thereon are removed in the plate-making step. The characteristic feature can be exhibited also in a water-less PS plate designed so that the photosensitive layer is not removed in the plate-making step but only the silicone rubber layer in the image area is selectively removed because of the photo-bonding property or photo-releasing property of the photosensitive layer.

In this case, the PS plate has an advantage that it is resistant to a strong rubbing with the solution of a developing agent in an organic solvent or water.

EXAMPLES

The following examples will further illustrate the present invention.

EXAMPLE 1

A primer layer material having the following composition was applied to a smooth aluminum plate which had been degreased by an ordinary method, in an amount of 1.0 g/m$^2$ in terms of dry weight. The plate was then maintained at 100° C. for 2 minutes, to harden and dry the coated layer.

| | | |
|---|---|---|
| (a) | Photographic gelatin 680 (produced by Nitta Gelatin Kabushiki Kaisha | 100 parts (by weight) |
| (b) | $CH_2\!=\!CHSO_2CH_2CH\!-\!CH_2SO_2CH\!=\!CH$ $\quad\quad\quad\quad\quad\quad\ \ \|$ $\quad\quad\quad\quad\quad\quad\ \ OH$ | 14.4 parts |
| (c) | N—(β-Aminoethyl)-γ-aminopropyl-trimethoxysilane | 7 parts |
| (d) | Pure water | 4000 parts |

After drying, the product was left to stand at room temperature (about 20° C.) for 4 days to stabilize the hardened film. Then, the degree of swelling with water at 20° C. was determined to reveal that it was 70 to 90%.

The following photosensitive composition was applied onto the primer layer formed on the aluminum plate in an amount of 0.25 g/m$^2$ and then dried.

| | |
|---|---|
| Photosensitive unsaturated polyester formed by, polycondensation of p-phenylenediacrylate and 1,4-dihydroxyethyloxycyclohexane in a molar ratio of 1:1 | 10 parts |
| 1-methyl-2-benzoylmethylene-β-napthothiazoline | 0.6 part |
| N—(β-aminoethyl)aminomethylphenethyl trimethoxysilane | 0.4 part |
| Dibutyltin dioctanoate | 0.8 part |
| Sumitone Cyanine Blue VH 514 (Phthalocyanin Blue produced by Sumitomo Kagaku Kabushiki Kaisha) | 2 parts |
| Ethylene glycol monomethyl ether acetate | 600 parts |
| Toluene | 300 parts |

Then, the following silicone rubber composition was applied to the photosensitive layer in an amount of 2.0 g/m$^2$ in terms of dry weight and then dried to obtain a cured silicone rubber layer.

| Dimethylpolysiloxane having hydroxyl groups at both ends (molecular weight: about 60,000) | 100 parts |
|---|---|
| Methylhydrogen polysiloxane having trimethylsilyl groups at both ends (molecular weight: about 2500) | 3.5 parts |
| 1-methoxysilylpropyl-3,5-diallyl isocyanurate | 3.3 parts |
| Dibutyltin dioctanoate | 3.3 parts |
| Isopar G (produced by Esso Kabushiki Kaisha) | 2000 parts |

A polypropylene film with its one side having a mat surface and having a thickness of 12μ was superposed on the surface of the silicone rubber layer thus obtained to form a water-less PS plate having a laminated structure.

A positive film was placed on the thus obtained PS plate and was held in close contact therewith in vacuum. The plate was exposed with an ordinary exposing device. The laminate film was then peeled off and the plate was immersed for 1 minute in an aqueous developing solution having the following composition. The plate was then lightly rubbed with a developing pad for 1 or 2 minutes, so that unexposed portion of the photosensitive layer and the corresponding silicone rubber layer thereon were removed. Thus, a water-less plate was obtained in which the image on the positive film was reproduced with a high fidelity over the entire area of the plate. Composition of the aqueous developing solution:

| Isobutyl acetate | 50 parts (by weight) |
|---|---|
| Benzyl alcohol | 10 parts |
| Pelex NBL (38% aqueous solution of an anionic surfactant; a product of Kao Atlas Co.) | 94 parts |
| Water | 50 parts |

When the water-less PS plate was strongly rubbed with the same developing solution above for 5 mins., the image of the positive film could be reproduced with a high fidelity without impairing the image. It was thus confirmed that the developing latitude with the aqueous developing agent was sufficiently broad. The thus obtained water-less plate was lightly wiped with the following dye solution. Only the image of the exposed portion of the primer layer was dyed in vivid blue. When the plate was strongly rubbed with the dyeing solution, the image was not impaired and the details could be dyed.

| Methylene Blue (CI 52015) | 1 part (by weight) |
|---|---|
| Water | 100 parts |

EXAMPLES 2 AND 3 AND COMPARATIVE EXAMPLES 1 to 3

Water-less PS plates were prepared in the same manner as that of Example 1 except that the components (b) and (c) of the composition of the gelatin primer layer and the hardening conditions were changed as shown in Table 1. The degree of swelling of the gelatin primer layer with water at 20° C. and the image reproducibility obtained by the strong rubbing with the same aqueous developing solution as in Example 1 were examined.

TABLE 1

|  | (b) Component | (c) Component | Hardening conditions | Degree of swelling | Image reproducibility with aqueous developing solution |
|---|---|---|---|---|---|
| Example 1 | CH$_2$=CHSO$_2$CH$_2$CH(OH)—CH$_2$SO$_2$CH=CH$_2$<br>14.4 parts by weight | N—(β-aminoethyl)-γ-aminopropyltri-methoxysilane<br>7 parts by weight | Dried at 100° C. for 2 mins. and then stored at about 20° C. for 4 days | 70–90% | good |
| Example 2 | <br>11.3 parts by weight | N—(β-aminoethyl)-γ-aminopropyltri-methoxysilane<br>7 parts by weight | Dried at 100° C. for 2 mins. and then stored at about 20° C. for 5 days | 40–60% | good |
| Example 3 | Glyoxal solution 40% aqueous solution of Wako Jun'yaku Kogyo Co., Ltd.)<br>8.7 parts by weight | γ-glycidoxypropyl-trimethoxysilane<br>7 parts by weight | Dried at 100° C. for 2 mins. and then stored at about 45° C. for 3 days | 40–60% | good |
| Comparative Example 1 | CH$_2$=CHSO$_2$CH$_2$CH(OH)—CH$_2$SO$_2$CH=CH$_2$<br>14.4 parts by weight |  | Dried at 100° C. for 2 mins. and then stored at about 20° C. for 4 days | 70–90% | poor |
| Comparative Example 2 | <br>11.3 parts by weight |  | Dried at 100° C. for 2 mins. and then stored at about 20° C. for 5 days | 40–60% | poor |
| Comparative Example 3 | Glyoxal solution (40% aqueous solution of |  | Dried at 100° C. for 2 mins. and | 60–80% | poor |

TABLE 1-continued

| (b) Component | (c) Component | Hardening conditions | Degree of swelling | Image reproducibility with aqueous developing solution |
|---|---|---|---|---|
| Wako Jun'yaku Kogyo Co., Ltd.) 8.7 parts by weight | | then stored at about 45° C. for 3 days | | |

It is apparent from the results shown in Table 1 that the water-less PS plate of the present invention has a sufficient image reproducibility with the aqueous developing solution, while the water-less PS plate in which the primer layer is free of the silane coupling agent has an inferior image reproducibility with the aqueous developing solution.

EXAMPLE 4

A gelatin primer layer was formed on a smooth aluminum plate in the same manner as in Example 1.

The following photosensitive composition was applied to the primer layer in an amount of 1.0 g/m² in terms of dry weight and then dried:

| | |
|---|---|
| Copolymer of allyl methacrylate and β-hydroxyethyl methacrylate in a molar ratio of 9:1 | 94 parts (by weight) |
| 2-(4-Styrylphenyl)-4,6-bis-trichloromethyl-S-triazine | 6 parts |
| Propylene glycol monomethyl ether acetate | 1100 parts |
| Methyl ethyl ketone | 1100 parts |

A silicone rubber layer was provided on the photosensitive layer and the product was laminated with a polypropylene film in the same manner as in Example 1. The water-less PS plate was imagewise exposed and then immersed in a developing solution comprising 90 parts by weight of Isopar H (a product of EXXON Kagaku Co.), 7 parts by weight of diethylene glycol monobutyl ether, 3 parts by weight of diethylene glycol monoethyl ether and 5 parts by weight of diethyl succinate for one min. and then lightly rubbed with a developing pad to remove the photosensitive layer and silicone rubber layer from the non-exposed parts. Thus a water-less plate was obtained in which the image of the positive film was reproduced with a high fidelity over the entire area of the plate.

When the water-less PS plate was strongly rubbed with the same aqueous dyeing solution as that of Example 1, even the details of the image could be dyed without degrading the image.

EXAMPLE 5

To a smooth aluminum plate which had been degreased by an ordinary method, a primer composition which did not contain a hardener and had the following composition was applied in an amount of 2.0 g/m² in terms of dry weight. The plate was heated at 120° C. for 2 minutes to dry it.

| | Primer Composition | |
|---|---|---|
| (a) | Photographic gelatin 680 (produced by Nitta Gelatin Kabushiki Kaisha) | 100 parts (by weight) |
| (b) | N—(β-Aminoethyl)-γ-aminopropyltrimethoxysilane | 7 parts |
| (c) | Pure water | 3000 parts |

On the resultant primer layer, a hardener solution having the following composition was coated in an amount of 0.288 g/m² in terms of dry weight. Then, the layer was heated at 100° C. for one minute, to harden and dry the coated solution.

| Hardener Solution | |
|---|---|
| $CH_2=CHSO_2CH_2CH(OH)-CH_2SO_2CH=CH_2$ | 2 parts (by weight) |
| Methanol | 70 parts |
| Pure water | 30 parts |

After hardening, the primer layer was left to stand at room temperature of about 20° C. for one day. The primer layer was not peeled off even when it was strongly rubbed with the following aqueous developing solution. Namely, the primer layer had a sufficient layer strength.

| Aqueous Developing Solution | |
|---|---|
| Benzyl alcohol | 80 parts (by weight) |
| Pelex NBL (anionic surfactant produced by Kao Atlas Co.) | 75 parts |
| Water | 845 parts |

On the resultant primer layer provided on the aluminum plate, the photosensitive composition used in Example 4 was coated in an amount of 1.0 g/m² in terms of dry weight, and then dried.

A silicone rubber layer was provided on the photosensitive layer and the product was laminated with a polypropylene film in the same manner as in Example 1. the water-less PS plate was imagewise exposed and then immersed in a developing solution comprising 90 parts by weight of Isopar H (a product of EXXON Kagaku Co.), 7 parts by weight of diethylene glycol monobutyl ether, 3 parts by weight of diethylene glycol monoethyl ether and 5 parts by weight of diethyl succinate for one minute and then lightly rubbed with a developing pad to remove the photosensitive layer and silicone rubber layer from the non-exposed parts. Thus, a water-less plate was obtained in which the image of the positive film was reproduced with a high fidelity over the entire area of the plate.

When the water-less PS plate was strongly rubbed with the same aqueous dyeing solution as that of Example 1, even the details of the image could be dyed without degrading the image.

What is claimed is:

1. A photosensitive lithographic plate requiring no dampening water, which comprises a support, a primer layer comprising a gelatin and a silane coupling agent, a photosensitive layer, and a silicone rubber layer, in this order.

2. The photosensitive lithographic plate of claim 1, wherein said silane coupling agent has the following general formula:

wherein R represents a hydrogen atoms or an alkyl group having 1 to 5 carbon atoms, X represents an alkyl group, a vinyl group or an organic group having a functional group capable of bonding with an organic matrix polymer or having an affinity for the organic matrix polymer, Y represents a hydroxyl group or an organic group which can be hydrolyzed to form a hydroxyl group, and n is a number of 2 or 3.

3. The photosensitive lithographic plate of claim 2, wherein said silane coupling agent is selected from N-(β-aminoethyl)-γ-aminopropyltrimethoxysilane, N-(β-aminoethyl)-γ-aminopropylmethyldimethoxy-silane, glycidoxypropyltrimethoxysilane, and vinyltrichlorosilane.

4. The photosensitive lithographic plate of claim 1, wherein the degree of swelling of the primer layer with water at 20° C. is adjusted to at most 150%.

5. The photosensitive lithographic plate of claim 4, wherein the degree of swelling of the primer layer with water at 20° C. is adjusted to at most 100%.

6. The photosensitive lithographic plate of claim 1, wherein the thickness of the primer layer is 0.1 to 50μ.

7. The photosensitive lithographic plate of claim 6, whrein the thickness of the primer layer is 0.5 to 20μ.

8. The photosensitive lithographic plate of claim 1, wherein said silane coupling agent is used in an amount of 1 to 20 wt. % based on said gelatin.

9. The photosensitive lithographic plate of claim 8, wherein said claim coupling agent is used in an amount of 3 to 10 wt. % based on said gelatin.

* * * * *